United States Patent [19]

Dobrovolny

[11] 4,399,419

[45] Aug. 16, 1983

[54] LINE ISOLATION AND INTERFERENCE SHIELDING FOR A SHIELDED CONDUCTOR SYSTEM

[75] Inventor: Pierre Dobrovolny, North Riverside, Ill.

[73] Assignee: Zenith Radio Corporation, Glenview, Ill.

[21] Appl. No.: 282,824

[22] Filed: Jul. 13, 1981

Related U.S. Application Data

[63] Continuation-in-part of Ser. No. 132,020, Mar. 20, 1980, abandoned.

[51] Int. Cl.[3] .......................... H03H 7/01; H01P 1/202; H01P 1/215

[52] U.S. Cl. .......................... 333/12; 333/206; 333/245; 333/260; 334/85

[58] Field of Search .......................... 333/12, 24 R, 24 C, 333/27, 167, 181, 182, 185, 202, 206, 245, 243, 248, 260; 339/143 R, 143 C, 147 R; 334/85; 455/50, 63, 128, 283, 286, 287, 296–298, 300–301

[56] References Cited

U.S. PATENT DOCUMENTS

| | | | |
|---|---|---|---|
| 3,617,607 | 11/1971 | Williams | 333/245 X |
| 3,908,176 | 9/1975 | Deboer | 333/24 C |
| 3,970,969 | 7/1976 | Sirel et al. | 333/12 |
| 4,267,529 | 5/1981 | Brun et al. | 333/185 |

OTHER PUBLICATIONS

"RCA Television Service Data-Chassis CTC 108 Series" RCA Corporation Consumer Electronics, Copyright 1980; Title Page and p. 50.

*Primary Examiner*—Marvin L. Nussbaum

[57] ABSTRACT

A method and structure is disclosed for isolating the shield of a shielded conductor system from a low frequency power source to which the shield may be connected. In one embodiment, the isolation technique includes providing an interruption in the conductor's shield and situating within the interruption dielectric and magnetically absorptive material so as to create at least a pair of capacitance across the interruption, and such that the capacitances are separated by magnetically absorptive material. In this manner, low frequency isolation is achieved and the field within the cable is shielded from ambient high frequency electromagnetic interference which could otherwise leak through the interruption into a desired high frequency signal path within the conductor. In other embodiments, at least some of the dielectric material forms part of a series resonator to improve attenuation of electromagnetic interference at low VHF frequencies.

56 Claims, 19 Drawing Figures

LINE ISOLATION AND INTERFERENCE SHIELDING FOR A SHIELDED CONDUCTOR SYSTEM

CROSS-REFERENCE TO RELATED APPLICATION

This application is a continuation-in-part of copending application Ser. No. 132,020, filed Mar. 20, 1980, now abandoned.

BACKGROUND OF THE INVENTION

This invention relates generally to the fields of high frequency electromagnetic interference shielding an A.C. power isolation. It is particularly directed to the shielding of high frequency shielded conductor systems, such as coaxial cables, from electromagnetic interference and the simultaneous isolation of such conductor systems from sources of A.C. power. The 75 ohm coaxial cable input to a television tuner is a prime example of one type of shielded conductor to which such shielding and isolation is directed.

Television receiver manufacturers are currently required by Underwriters Laboratories (U.L.) to doubly isolate exposed metal parts from the A.C. line which powers the receiver. For example, the 300 ohm twin lead terminals usually situated on the rear of the receiver's cabinet are required to be separately isolated. Such isolation is intended to doubly insulate a consumer from accidental shock which he might otherwise receive either from contact with the exposed terminals or with the metal "rabbit ear" antenna to which such terminals are sometimes connected.

Conventionally, television receivers also include an exposed connection for a 75 ohm coaxial cable input to the receiver's VHF tuner. No U.L. requirement presently exists providing for double isolation of the coaxial input, evidently because the technology has not been available to television manufacturers to enable them to provide such isolation while simultaneously affording acceptable television reception.

The problem which arises in connection with the 75 ohm coaxial input is that conventional techniques for isolating the coaxial input from the A.C. line tend to permit ambient high frequency electromagnetic interference signal to couple with the field within the cable, and thus to interfere with the desired signal propagating inside the coaxial cable.

For example, one prior approach utilizes conventional capacitors coupling the coaxial cable with the tuner input to A.C. isolate the cable from the tuner. While the isolation thus achieved is satisfactory, the field within the cable is inadequately shielded from electromagnetic interference.

A more recent isolation technique, described in copending application Ser. No. 184,720, filed Sept. 8, 1980, employs a feed-through or tubular type capacitor in the cable for A.C. isolation. The latter arrangement does provide the required degree of A.C. line isolation but, in fields of strong ambient electromagnetic interference, its shielding effect is less than perfectly satisfactory.

The shielding problems mentioned above may be particularly evident where the coaxial cable, connected to the 75 ohm input, carries a CATV signal. If the cable includes an A.C. isolator which is an inadequate electromagnetic interference shield, strong co-channel ambient broadcast fields will not be adequately shielded from the field within the coaxial cable and will produce strong co-channel interference.

For the reasons stated above, presently available A.C. isolators have not proven adequate where electromagnetic interference shielding is of importance.

OBJECTS OF THE INVENTION

It is a general object of the invention to provide a method and apparatus for isolating the shield of a shielded high frequency conductor system from low frequency A.C. power in such a way that the desired field within the cable is shielded from ambient high frequency electromagnetic interference.

It is another object of the invention to provide such isolation and shielding for a shielded conductor system adapted to carry a television signal to the tuner of a television receiver.

BRIEF DESCRIPTION OF THE DRAWINGS

The objects stated above and other objects of the invention are more particularly set forth in the following detailed description and in the accompanying drawings, of which.

DESCRIPTION OF THE PREFERRED EMBODIMENT

Figure 1:
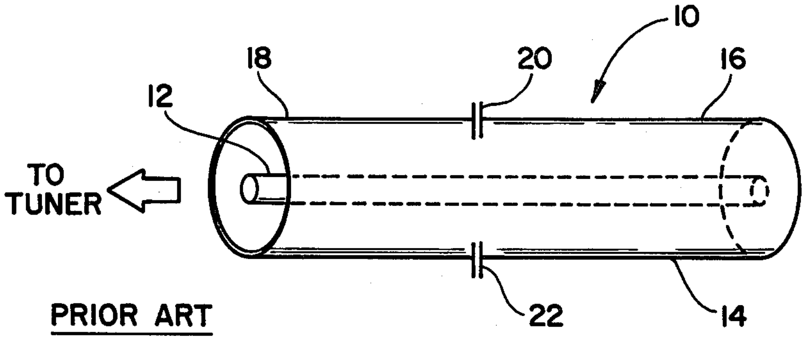
FIG. 1 illustrates a coaxial cable having conventional capacitive A.C. line isolation.

Referring to FIG. 1, a coaxial cable 10 is shown which may be used for carrying a television signal to the tuner of a television receiver. The cable 10 has an inner conductor 12 disposed coaxially within an outer conductor 14. The rightmost end 16 of the cable may be coupled to a signal source and the leftmost end 18 may be coupled to the input of a television tuner.

Conventionally, the tuner may be isolated from the A.C. line which powers the receiver. To doubly isolate the end 16 of the cable from the A.C. line, it has been proposed to capacitively couple the ends 16 and 18 of the outer conductor 14. This prior approach is indicated schematically by capacitors 20 and 22 disposed in the cable's outer conductor. The capacitors 20 and 22 are selected to provide a high impedance at the low frequencies associated with the A.C. line, thereby to further isolate the end 16 of the cable from the line voltage. The inner conductor 12 may also be decoupled from the A.C. line by a capacitor (not shown).

Although the isolation effected by the technique shown in FIG. 1 is satisfactory, the simple capacitive decoupling of the outside conductor can cause an intolerable increase in electromagnetic interference, particularly when a local signal is broadcast on the same frequency as a CATV signal carried by the cable.

Figure 2:
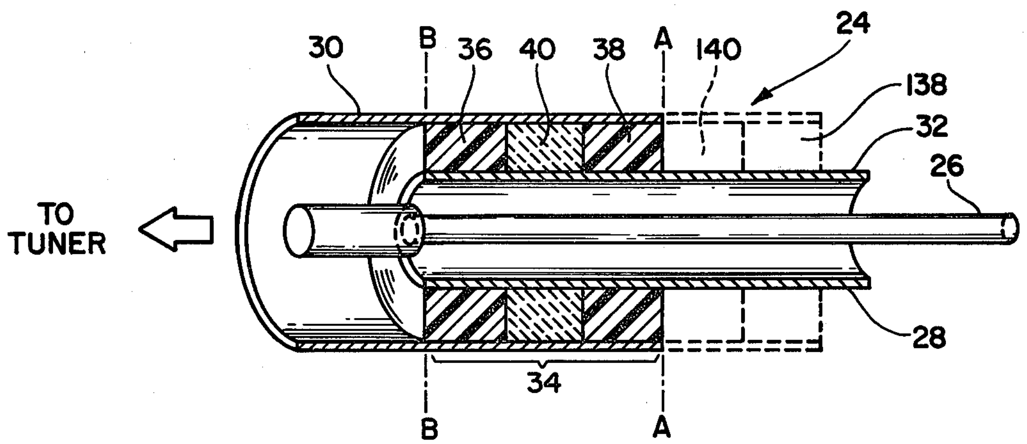
FIG. 2 illustrates a cable-isolator assembly in accordance with the invention.

FIG. 2 shows a preferred embodiment of one type of isolator according to the invention. A shielded conductor system in the form of a coaxial cable 24 includes an inner conductor 26 and an outer conductor 28. The cable may include a leftmost portion 30 whose outer diameter is greater than the outer diameter of the rightmost portion 32 such that a portion 34 of the larger diameter outer conductor overlaps the smaller diameter outer conductor. The space defined by such overlap constitutes a gap or interruption in which dielectric and magnetically absorptive material is situated for purposes of shielding and line isolation.

In the illustrated embodiment, the annular, cavity-like interruption thus created holds two discrete elements of dielectric material 36 and 38 separated by an element of magnetically absorptive material 40. Each such element is annular and has a central opening to surround the smaller diameter outer conductor. The elements 36, 38 and 40 may be stacked one against the other and aligned coaxially of the cable as illustrated.

With this arrangement, the dielectric elements 36 and 38 create a capacitive coupling across the gap between the large and small diameter portions of the outer conductor to isolate the rightmost portion 32 of the outer conductor from the leftmost portion 30. Hence, any A.C. line voltage applied to the leftmost portion 30 is inhibited from reaching the rightmost portion 32. In addition, the capacitances formed by the elements 36 and 38 co-operate with the element 40 to shield the field inside the cable 24 from ambient electromagnetic radiation, as described hereinafter.

The magnetically absorptive element 40 serves to absorb electromagnetic interference not bypassed by the capacitive effect of elements 36 and 38, without any substantial absorption of the desired field within the cable.

Figure 3:
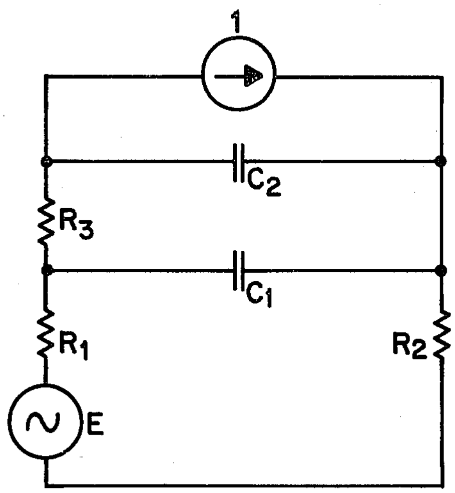
FIG. 3 is a lumped-element equivalent circuit diagram useful in explaining the operation of the embodiment shown in FIG. 2.

To more fully explain the shielding effect achieved, reference is made to FIG. 3 which shows an equivalent circuit diagram of a two port which may be placed between the cross sections AA (input port) and BB (output port) of FIG. 2. The source I represents the current on the outer surface of the outer conductor induced in the vicinity of the cross section AA by the ambient interfering signal. The source E represents the desired signal to be carried by the cable, the resistor R1 represents the nominal output impedance of the source E (75 ohms), and the resistor R2 represents the nominal input impedance (75 ohms) of a television tuner.

The resistor R3 represents the equivalent series resistance (100 ohms, for example) of the magnetically absorptive element 40, the capacitor C1 represents the capacitance due to the effect of the dielectric element 36, and the capacitor C2 represents the capacitance due to the effect of the dielectric element 38. Each capacitor C1 and C2 may, by way of example, have a value of about 2000 picofarads.

At typical television frequencies, the impedance of the capacitors C1 and C2 is much less than the impedance of any of the resistors in FIG. 3, Hence, the capacitor C1 shunts the desired signal from source E away from the resistance R3 and toward the input impedance of the tuner. Consequently, the magnetically absorptive material represented by R3 does not substantially absorb any of the desired signal.

The capacitor C2 acts to shunt the current I so that the interference current does not develop a substantial corresponding voltage in R2 (the tuner input impedance).

Because the capacitor C2 has only a finite capacitance, not all the current I will be shunted. However, capacitors C1 and C2 cause the residual electromagnetic interference to be absorbed by the magnetically absorptive material (R3).

It should be mentioned that any magnetically absorptive material will also produce an equivalent and frequency dependent inductance which is in series with its equivalent resistance. Such inductance may help to suppress interference at lower frequencies, but it is not very desirable at higher frequencies. Hence, the magnetically absorptive material should be selected to maximize interference suppression at the frequencies of interest for a particular application.

Referring again to FIG. 2, the arrangement shown therein has been found to provide exceptional shielding from electromagnetic interference while simultaneously providing isolation from the line voltage. The dielectric elements 36 and 38 may be of any suitable dielectric material preferably having a high dielectric constant of several thousands to provide a capacitance of at least 2000 picofarads. Barium titante is one example of such dielectric material.

The element 40 is made of a magnetically absorptive material whose equivalent series resistance is as high as possible at the frequencies of interest for best absorption of electromagnetic interference. A ferrite material having an equivalent series resistance of about 100 ohms has been found to be acceptable for use at television frequencies. Such a ferrite is available from Fair-Rite Products Corp., Wallkill, N.Y., referred to as material number 43 or 64.

In constructing the isolator, the dielectric elements 36 and 38 may be silver plated inside and outside and soldered to the outer conductor 28 on the inside and to the outer conductor 30 on the outside. The magnetically absorptive element 40 may be in the form of a ferrite bead disposed loosely between the dielectric elements and need not be in physical contact with the cable's outer conductor. It is thought that greater A.C. line isolation may result if no such contact is permitted, particularly in the case where ferrite materials with a high D.C. specific conductance are used.

It will be appreciated that the isolator-cable combination may be used in applications other than with television tuners. However, when the cable 24 is designed to carry a signal to a television tuner, the interruption or cavity described above need not be completely disposed in the cable alone. For example, in FIG. 2, the leftmost portion 30 of the cable (the part of larger diameter) may actually be an input connector to a television tuner. In that case, the larger diameter portion of the connector may be extended over the smaller diameter cable so that an area of axial overlap exists as shown, with the dielectric and magnetically absorptive material disposed in the gap defined by the area of axial overlap. Hence, when an interruption is referred to herein as being in the outer conductor of a cable, it is to be understood that such terminology is meant to also include an interruption between the outer conductor of the cable and a corresponding connection to a tuner input or corresponding structure. In fact, the required isolation and shielding may be effected by disposing the interruption at any practical location in a coupling path between the outer conductor of the cable and the input to the tuner or corresponding structure.

Such a connector and cable as shown in FIG. 2 may be disposed within a television receiver's cabinet. In that case, the cable itself need not be flexible as is the case with conventional coaxial cable. Instead, the cable may be constructed of conductive pipe having a center conductor. Such a pipe will be understood to be the equivalent of a coaxial cable, wherefore, references herein to a coaxial cable or a shielded conductor are intended to be inclusive of such pipes.

In some instances, the interruption may be implemented without the use of either a coaxial cable or a conductive pipe. Instead, the interruption may be placed within a connector which is attached directly to a television tuner or corresponding structure. Hence, references herein to a shielded conductor are meant to include such connectors and their equivalents.

The isolator of FIG. 2 comprising the elements 36, 38 and 40 is illustrated as employing only one ferrite or magnetically absorptive element disposed between a pair of dielectric elements. However, additional dielectric and ferrite elements may be used in an alternating sequence, as shown in phantom at 138 and 140, respectively. In the illustrated embodiment, the first element on the inside (element 36 in FIG. 2) is a dielectric element so that no losses are introduced into the desired signal path. The first element on the outside (element 38 in FIG. 2) may be either a dielectric element or a magnetically absorptive element, the former case being more effective.

There are several alternatives for the design of an A.C. line isolator, the construction of which depends on the main direction in which the electromagnetic interference signal within the isolator is forced to propagate (radially or axially). The construction shown in FIG. 2 illustrates a case in which the interference signal propagates axially and the dielectric-ferrite pairs are distributed axially.

Figure 4:
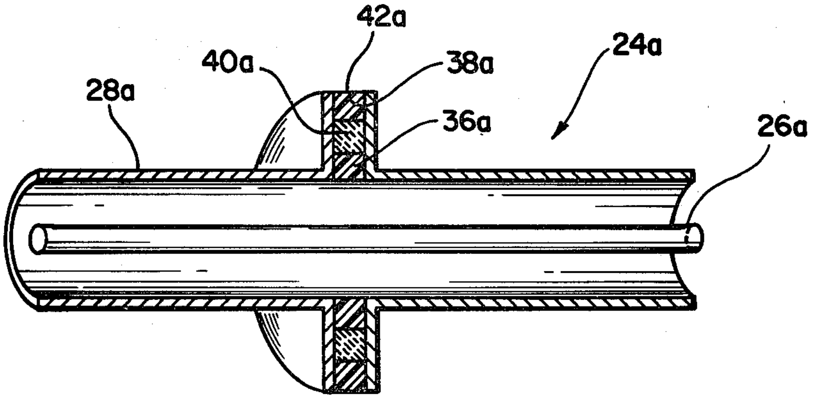
FIGS. 4–6 illustrate alternate embodiments of the isolator assembly shown in FIG. 2.

FIG. 4 illustrates an isolator in a coaxial cable for radially propagating interference signals and having radially distributed dielectric-ferrite elements. As shown, the cable **24*a* has an inner conductor 26*a* and an outer conductor 28*a*. The latter conductor is divided with upturned edges or radial flanges arranged vis-a-vis to form a gap or interruption 42*a* in which dielectric elements 36*a* and 38*a* are separated by a ferrite or other type of magnetically absorptive element 40*a* so that the dielectric and magnetically absorptive elements are sandwiched between the flanges and concentrically arranged such that the alternating sequence of elements is in a direction radial to the cable. Again, as in the FIG. 2** embodiment and other embodiments to follow, a greater number of dielectric and magnetically absorptive elements may be employed in alternating sequence in applications where greater performance is desired in spite of the necessarily higher consequent cost.

Figure 5:
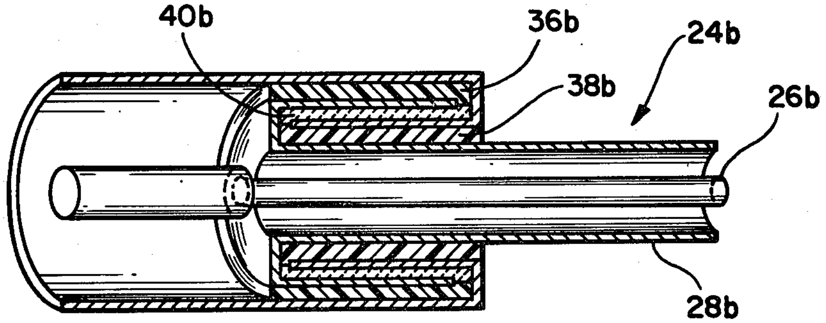

Referring to FIG. 5, an alternative design is shown for the case in which the interference signal propagates axially and the dielectric-ferrite pairs are disposed radially. In this design, the cable **24*b* has an inner conductor 26*b* and an outer conductor 28*b*, the latter being separated into two parts (left and right, as shown). The ends of the separated parts are interleaved so as to provide a total of at least three spaces between the interleaved parts. A first space contains a dielectric element 36*b*, a second space contains a magnetically absorptive element 40*b*, and a third space contains another dielectric element 38*b***.

Figure 6:
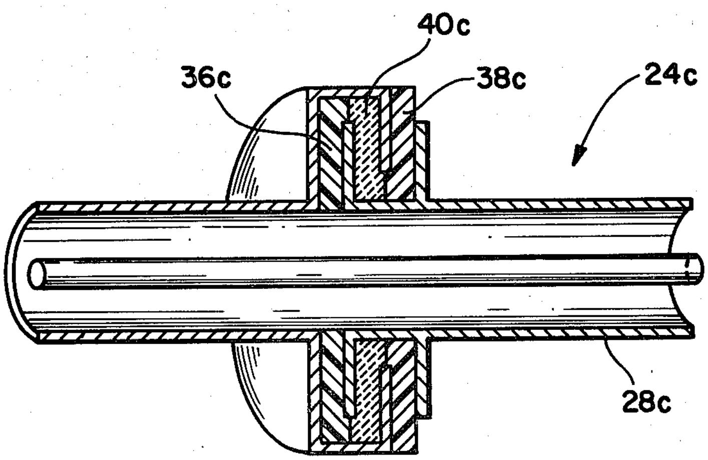

Another embodiment is shown in FIG. 6 in which the interference signal propagates radially and the isolator elements are distributed axially. Again, an outer conductor **28*c* of the cable 24*c* is separated into two parts as shown. The separated parts of the outer conductor are interleaved to provide at least three spaces. A dielectric element 36*c* is disposed in a first space, a magnetically absorptive element 40*c*** is disposed in a second space, and another dielectric element is disposed in the third space.

In FIGS. 2 and 4–6, the dielectric and ferrite elements are shown as abutting each other. The reasons for this preferred construction are twofold.

First, maintaining the ferrite and dielectric elements in an abutting relationship eliminates air gaps between them. Large air gaps, if present, represent inductances which can provide parasitic resonances at some television frequencies. Consequently, less attenuation of electromagnetic interference can occur.

Second, maintaining the dielectric elements immediately adjacent a sandwiched ferrite element tends to hold the ferrite element in its proper position.

The cable shielding and isolation technique described above has been found to provide satisfactory isolation and superior shielding from electromagnetic interference. In fact, measurements in television receivers exposed to strong ambient fields have shown that an isolator-cable assembly of the type shown in FIG. 2 provides interference suppression which is approximately equivalent to the interference suppression provided by a singly isolated, fully shielded cable, the primary limitation on electromagnetic interference pickup being the construction and quality of shielding built into the tuner.

There are circumstances in which strong ambient fields exist, particularly in the low UHF television band (around 50–60 megahertz) and/or in the FM band. In these conditions, it is desirable for the isolator to exhibit very good RFI (Radio Frequency Interference) attenuation characteristics, particularly at these relatively low frequencies. Of course, good RFI attenuation should also be provided at frequencies up to and above about 175 megahertz.

Figure 7:
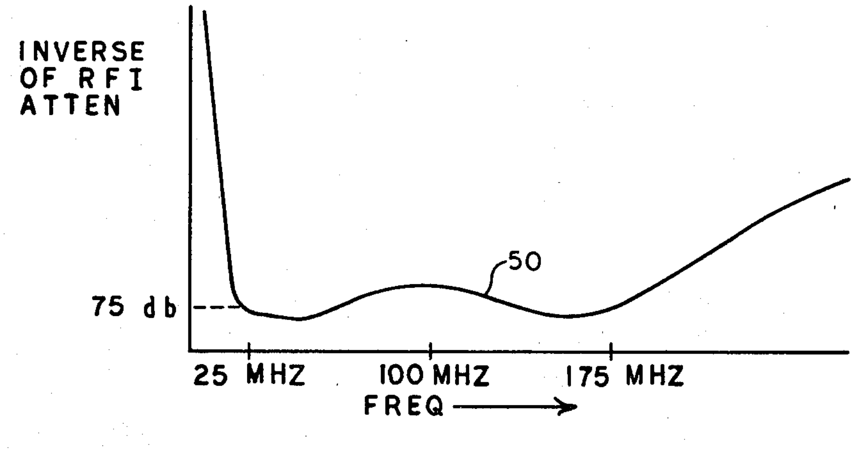
FIG. 7 illustrates the interference attenuation characteristics of a conventional discrete isolator.

Referring to FIG. 7, the curve 50 illustrates the RFI attenuation characteristics of a conventional isolator. As shown, good RFI attenuation is achieved at about 25 megahertz, but the attenuation decreases somewhat at around 100 megahertz and decreases even further at frequencies above 175 megahertz.

Figure 8:
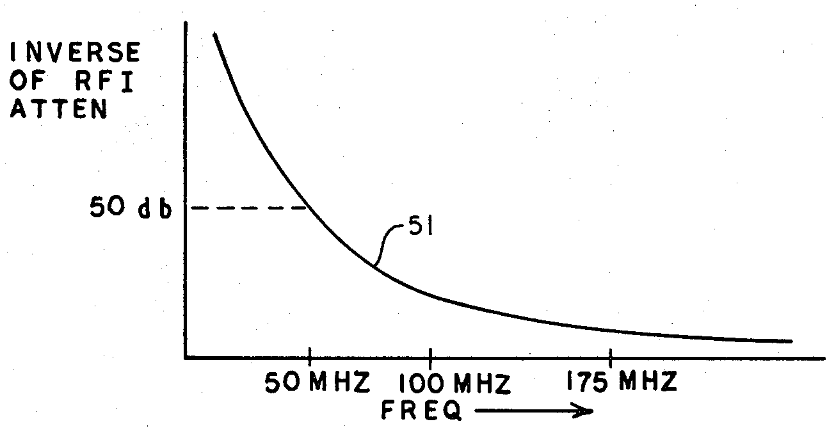
FIG. 8 illustrates the interference attenuation characteristics of the isolator assembly shown in FIG. 2.

FIG. 8 illustrates the RFI attenuation characteristics of an isolator of the type shown in FIG. 2. As indicated by the curve 51, RFI attenuation increases monotonically as a function of increasing frequency to provide very good attenuation at high frequencies and reasonable attenuation at low frequencies.

To provide even greater attenuation at lower frequencies, particularly in the 50 to 60 megahertz range (the low VHF band) in accordance with another aspect of the invention, an inductance is provided within the shield's interruption for coacting with at least some of the dielectric material therein to form at least one resonator. Preferably, the resonator establishes a condition of series resonance for frequencies in the low VHF band to increase RFI attenuation at those frequencies.

Figure 9:
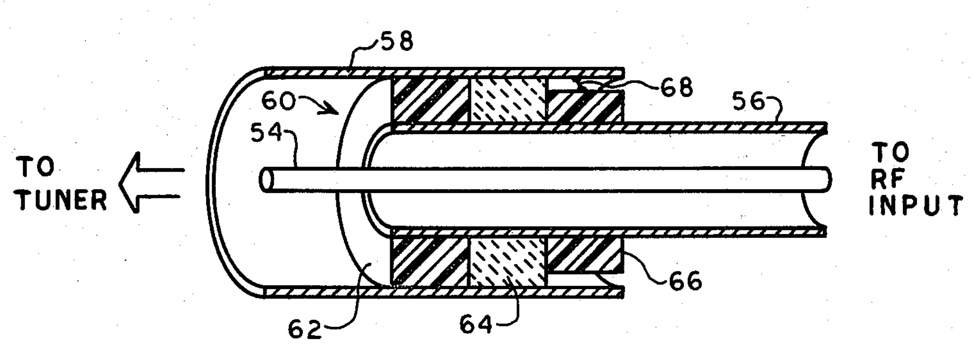
FIG. 9 is a cross-sectional view of another isolator in accordance with the invention in which one of the dielectric elements is connected with an inductance to form a resonator.

One manner of providing such a resonator is illustrated in FIG. 9. As shown, a shielded conductor having an inner conductor 54 and a shield 56 is mated with any suitable conductive means such as a larger diameter shield 58 to form an interruption or area or axial overlap 60. The shield 56 and the inner conductor 54 may receive an RF input, and the shield 58 and the inner conductor may carry the RF input to a television tuner or the like.

Disposed within the interruption is an annular dielectric element 62, an annular magnetically absorptive element 64, and another annular dielectric element 66. Adjacent elements abut each other and are arranged concentrically around the shield 56. The elements 62 and 66 each have conductive coatings (not shown) on their inner and outer perimeters so that their inner perimeters may be soldered to the shield 56 and the outer perimeter of the element 62 may be soldered to the shield 58.

The dielectric element 62 and the magnetically absorptive element 64 function in the same manner as the dielectric and magnetically absorptive elements described previously. In this embodiment, however, the dielectric element 66 has an outer diameter which is smaller than the outer diameter of the element 62 so that its outer conductive coating is not in physical contact with the shield 58.

A conductive finger 68 (which may be a part of the shield 58) extends into the interruption to make an electrical connection between the shield 58 and the outer conductive coating on dielectric element 66. The length and width of the finger 68 and the dielectric constant of the element 66 are selected so that the inductance provided by the finger 68 coacts with the dielectric element 66 to form a resonator which exhibits series resonance in the low band of VHF frequencies (50–60 megahertz). Consequently, additional RFI attenuation is provided at these frequencies without substantially reducing the attenuation provided at higher frequencies.

Figure 11:
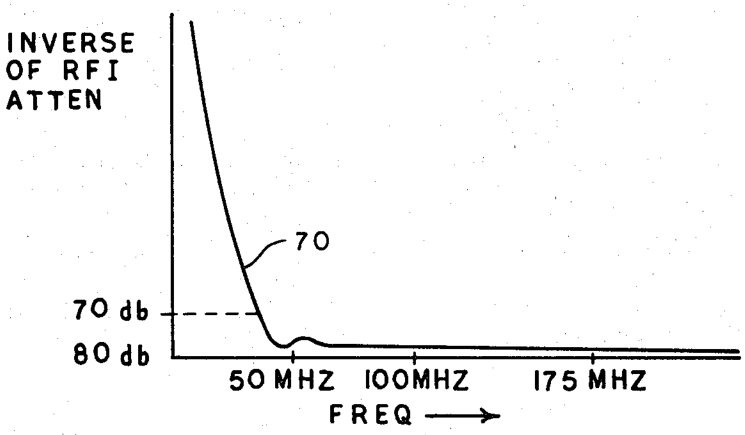
FIG. 11 illustrates the interference attenuation characteristics of the isolator shown in FIG. 10.

When the dielectric element 66 is selected to exhibit a capacitance of 1.5 nanofarads and the finger 68 is selected to exhibit an inductance of 7 nanohenries, the resonator is series resonant at approximately 50 megahertz. The attenuation characteristics of that isolator are depicted in FIG. 11.

As shown by the curve 70, a local attenuation maximum is obtained at about 50 megahertz, and the attenuation keeps increasing with increasing frequency. Thus, the isolator of FIG. 9 provides very good RFI attenuation over a wide frequency range.

Figure 10:
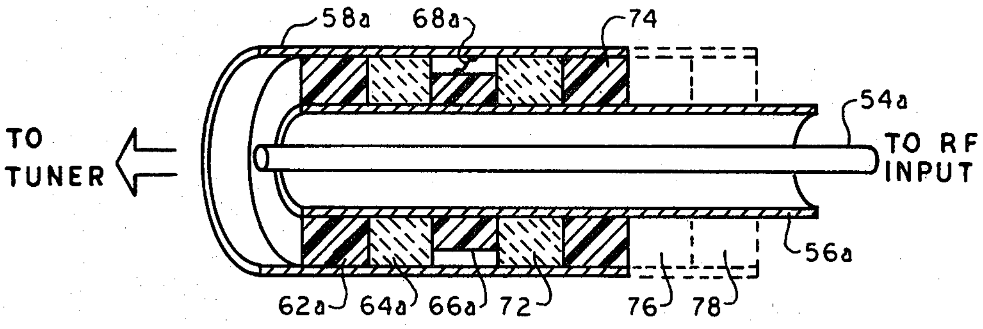
FIG. 10 is a cross-sectional view of the type of isolator shown in FIG. 9, but having additional ferrite and dielectric elements.

Isolators of the type shown in FIG. 9 are not limited to three elements. As shown in FIG. 10, for example, an isolator may include dielectric elements **62*a* and 66*a* sandwiching a magnetically absorptive element 64*a*, and an inductive finger 68*a*, all of which function in the manner described previously. Abutting the element 66*a* is another magnetically absorptive element 72 followed by another dielectric element 74. The inclusion of the elements 72 and 74 further increases RFI attenuation. The use of an additional magnetically absorptive element at 76 and another dielectric element at 78** will increase RFI attenuation even further. However, an additional increase in the number of dielectric and magnetically absorptive elements has a reduced effect on the rate at which RFI attenuation increases, the reason being that the total capacitance should not exceed 4 ramofarads.

Figure 12:
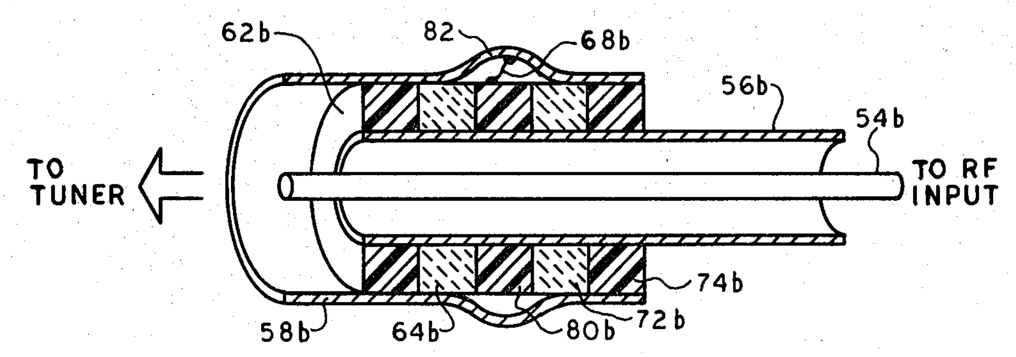
FIG. 12 is a cross-sectional view of another embodiment of a FIG. 10 type isolator.

In the embodiments of FIGS. 9 and 10, the dielectric part of the resonator was made physically smaller than the other dielectric elements to avoid direct contact with the large diameter outer shield. Another manner in which this result may be obtained is illustrated in FIG. 12.

As shown, elements **62*b*, 64*b*, 72*b* and 74*b* are concentrically disposed around the shield 56*b* in the same manner as depicted in FIG. 10. However, the resonator includes a dielectric element 80*b* which is of the same physical size as the other dielectric elements, and the shield 58*b* is formed so as to avoid direct contact between itself and the element 80*b*. This may be accomplished by forming the shield 58*b* so that it has a larger diameter portion 82 which surrounds the element 80*b* so that an inductance 68*b* may be electrically connected between the dielectric element 80*b* and the shield portion 82**.

Figure 13:
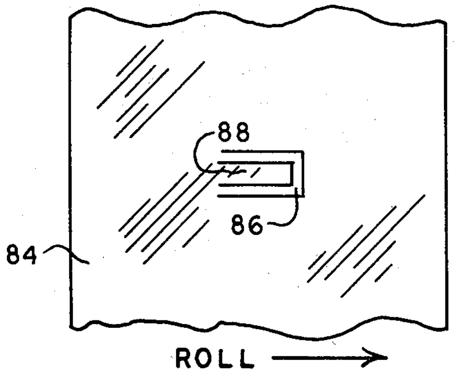
FIG. 13 depicts the shielded conductor of FIG. 12 as seen in an unrolled or flattened condition and the manner in which an inductive finger may be formed therein.

As described previously, the inductance or finger which forms part of the resonator may be a part of the outer shield which projects into the interruption. Such a finger may be provided as shown in FIG. 13 which illustrates an outer shield 84 in a flat condition prior to being rolled into its usually round shape. This shield 84 represents any one of the shields 58, **58*a* or 58*b***.

To provide a finger which forms part of a resonator, a U-shaped opening 86 may be stamped out of the shield to leave a finger 88. The shield may then be rolled in the direction indicated to complete its construction, and the finger 88 may be pressed inwardly into the interruption which is formed during the isolator's construction. This inwardly projecting finger may then be soldered to the dielectric element which forms part of a resonator.

In the case where the shield is to have a larger diameter portion as shown at 82 in FIG. 12, the shield 84 may be rolled over a die which is shaped to expand the diameter of the shield at the proper location.

Figure 14:
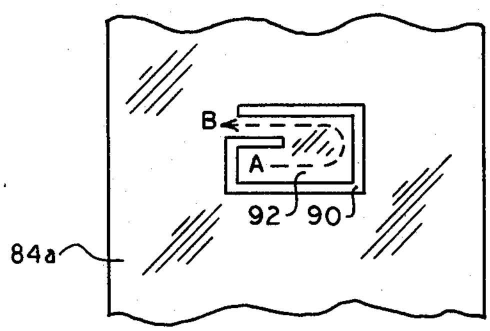
FIG. 14 illustrates another method of forming the inductive finger in the shielded conductor.

In applications where a relatively longer finger is to be formed in a shield, such a finger may be provided as shown in FIG. 14. Here, a shield **84*a* (prior to being rolled) has an opening 90 which is stamped out in the shape of a backward G. This provides a finger 92** whose electrical length extends between the illustrated points A and B. Larger inductance values may be obtained by stamping out a longer meandering finger.

After the finger 92 has been formed and the shield **84*a* has been rolled, the end (point A) of the finger 92** is bent inwardly to make contact with an outer conductive coating on an underlying dielectric element.

Figure 15:
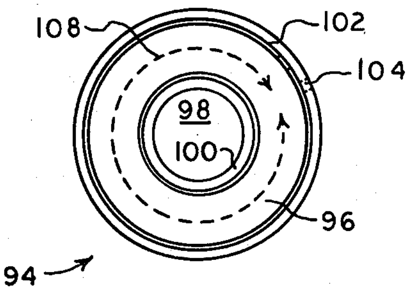
FIG. 15 is a front view of an alternate embodiment of an annular dielectric element, its metallization pattern, and the manner in which the metallization pattern is coupled to an outer conductor to form a resonator.
Figure 16:
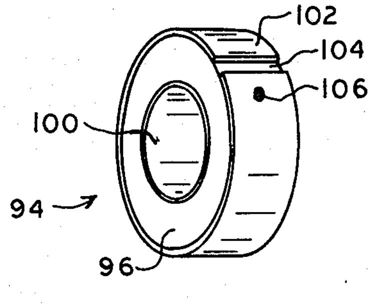
FIG. 16 is a perspective view of the dielectric element shown in FIG. 15.

Another form of isolator according to the invention may include a resonator which employs distributed as opposed to discrete inductance to coact with a dielectric body representing a distributed capacitance to create circumferential resonances and thereby provide selective attenuation at a set of frequencies. A resonating dielectric element according to this aspect of the invention is shown in FIGS. 15 and 16. This exemplary resonator 94 has an annular dielectric body 96 defining a central hole 98 through which an inner conductor will pass. Disposed around the hole 98 is an inner conductive coating 100. An outer conductive coating 102 is disposed around the outer circumference of the dielectric body 96, with a slot or gap 104 left in this coating. The outer coating 102 is intended to make electrical contact with an outer shield at a small point on the coating, such as the point 106.

By virtue of the illustrated construction, the resonator 94 is excited into modes of resonance which provide very low impedance mainly at wavelengths $\lambda 1$ and $\lambda 2$ given by $\lambda\frac{1}{4}=L$ and $\frac{3}{4}\lambda 2=L$, where L is approximately the mean circumference 108 of the resonator and $\lambda$ is the wavelength within the dielectric. By proper choice of the length L and the dielectric constant of the dielectric body 96, high RFI attenuation may be achieved in the low VHF band (by virtue of the $(\lambda/4)$ resonance) and at higher frequencies (by virtue of the $\frac{3}{4}\lambda$resonance).

Figure 17:
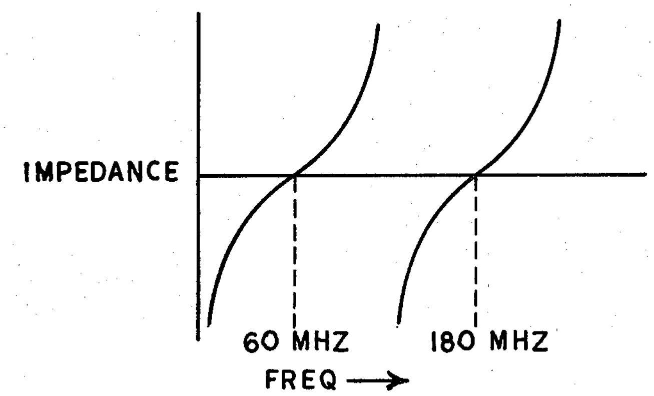
FIG. 17 is an idealized and abbreviated plot of impedance versus frequency for the type of resonator shown in FIG. 15.

Referring to FIG. 17 in which higher order resonance modes are omitted, a plot is shown of the idealized impedance versus frequency characteristics of the resonator depicted in FIGS. 15 and 16. This illustrates that a low impedance may be created in the vicinity of 60 and 180 megahertz to provide high RFI attenuation at those frequencies.

The reason why this type of resonator provides the characteristics shown in FIG. 17 is as follows. The outer conductive coating 102 essentially forms a distributed inductance, and the inner coating 100, along with the dielectric body 96 and the interrupted outer coating, form a distributed capacitance; the distribution of the inductance and capacitance is in the circumferential direction.

As a result of these distributed parameters, a low reactance is created between the point 106 and the point radially opposite it on the inner coating 100 at frequencies corresponding to odd multiples of $(\lambda/4)$. Thus, substantial RFI attenuation occurs at these frequencies.

Figure 18:
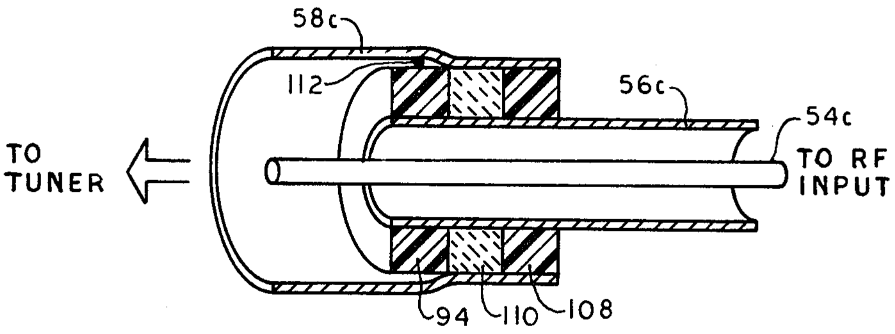
FIG. 18 is a cross-sectional view of an isolator assembly which includes the type of resonator shown in FIG. 15.

One manner in which this type of resonator may be built into an isolator is shown in FIG. 18. As with the previous embodiments, an inner conductor **54*c* and a relatively small diameter shield 56*c* receive an RF input which may be coupled to a television tuner via the conductor 54*c* and a larger diameter shield 58*c*. Disposed in the interruption established between shields 56*c* and 58*c* is an annular dielectric element 108, an annular magnetically absorptive element 110 and the resonator 94. To electrically connect the shield 58*c* to the conductive coating on the resonator 94, the shield may have a greater diameter where it overlies the resonator 94 and a short electrical connection, such as a solder joint 112, may couple the shield 58*c* to the resonator's coating as at point 106 (FIG. 16). No other electrical contact occurs between the shield 58*c* and the resonator 94**. With this arrangement, good RFI attenuation is provided over low VHF frequencies as well as higher frequencies.

Figure 19:
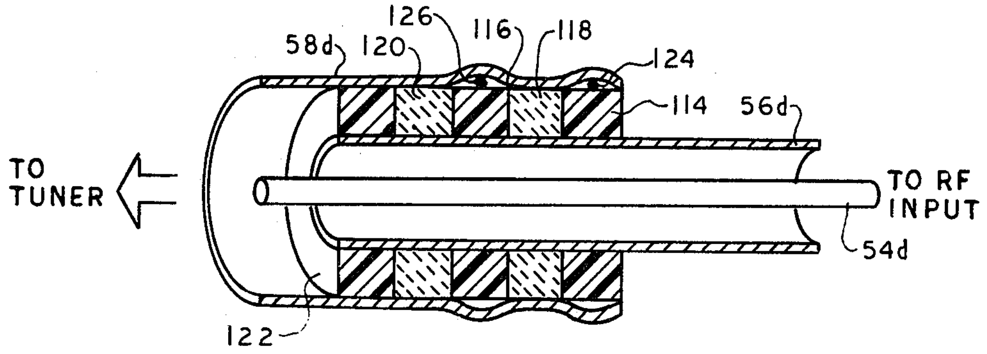
FIG. 19 is a cross-sectional view of an isolator assembly which includes two resonators of the type shown in FIGS. 15 and 16.

In certain applications, it may be desirable to include more than one of the FIG. 16 type resonators in a single isolator, along with additional dielectric and magnetically absorptive elements. One such resonator may be selected to provide high RFI attenuation at given frequencies, and another resonator may be selected to provide high RFI attenuation at other frequencies. Such an arrangement is shown in FIG. 19.

In this embodiment, resonators 114 and 116, of the type shown in FIG. 16, sandwich a magnetically absorptive element 118. These resonators may have resonances which occur at different frequencies. The resonant frequencies may be controlled for a given dielectric constant by varying the width of the plating gap 104 (FIG. 16).

Also included in the illustrated interruption are an additional magnetically absorptive element 120 and another dielectric element 122. As shown, solder joints 124 and 126 electrically connect the outer shield **58*d* to the conductive coatings (not shown in FIG. 19) on resonators 114 and 116, respectively. Further contact between the resonators' conductive coatings is avoided by the shield 58*d* having an enlarged diameter where it overlies resonators 114 and 116**.

As previously stated, the outer shield (such as shield **58*c*) need not be a conventional braided shield of the type used in coaxial cables. Likewise, the inner shield (56*c***, for example) need not be a braided shield. Both shields may be part of a connector or equivalent structure which defines an interruption to hold the various dielectric and magnetically absorptive elements.

Although the invention has been described in terms of its applicability to attenuation of RFI in television applications, it will be understood that the invention is not limited to that field. Moreover, those skilled in the art will appreciate that various modifications and alterations may be made to the method and structure described herein without departing from the invention. By way of example only, the conductors in FIGS. 9, 10, 12, 18 and 19 which are shown as receiving an RF input may alternately be coupled to a tuner or the like, with the designated tuner connection being used to receive the RF input. Many other changes will be apparent to those skilled in the art. Accordingly, it is intended that all such modifications and alterations be considered as within the spirit and scope of the invention as defined by the appended claims.

What is claimed is:

1. A method of isolating the shield of a shielded conductor system from a low frequency power source to which the shield may be coupled, and for shielding the field within the conductor system from ambient high frequency electromagnetic interference, comprising:

providing an interruption in the shield; and filling the interruption with dielectric and magnetically absorptive material selected and disposed to create a capacitive coupling across the interruption to isolate the shield and magnetic absorption within the interruption to absorb energy associated with the ambient electromagnetic interference.

2. A method as set forth in claim 1 including providing an inductance within the interruption for coacting with at least some of the dielectric material to form a resonator.

3. A method of isolating the shield of a shielded conductor system from a low frequency power source to which the shield may be coupled, and for shielding the field within the conductor system from ambient high frequency electromagnetic interference, comprising:

providing an interruption in the shield; and situating within the interruption a series of dielectric elements separated by abutting magnetically absorptive material to create a capacitive coupling across the interruption to isolate the shield and magnetic absorption within the interruption to absorb energy associated with the ambient electromagnetic interference.

4. The method as set forth in claim 2 including situating within said interruption discrete elements of dielectric material and magnetically absorptive material in alternating sequence.

5. A method as set forth in claim 4 further including providing an inductance within the interruption for coacting with at least one element of dielectric material to provide a series resonant circuit at a selected television frequency.

6. A method as set forth in claim 5 wherein said one element of dielectric material has an outer conductive coating thereon, and wherein said inductance is formed by a conductive finger connected between the dielectric element's conductive coating and the shield.

7. A method as set forth in claim 4 wherein the shield includes a relatively large diameter portion separated by the interruption from a relatively smaller diameter portion, such that the relatively large diameter portion overlaps the smaller diameter portion, and wherein the dielectric and magnetically absorptive elements are disposed between overlapping portions of the shield.

8. A method as set forth in claim 4 wherein said dielectric and magnetically absorptive elements are aligned coaxially within the shield's interruption.

9. A method as set forth in claim 4 wherein the shield is interrupted with a pair of radial flanges, arranged vis-a-vis, and wherein said dielectric and magnetically absorptive elements are sandwiched between the flanges and concentrically arranged such that the alternating sequence is in a direction radial to the conductor system.

10. A method as set forth in claim 4 wherein the interruption is provided by separating the shield into two parts, turning the ends of the separated parts and interleaving the turned ends so as to provide a total of at least three spaces between the interleaved parts, and wherein magnetically absorptive material is disposed in one of said spaces, and dielectric material is disposed in two of said spaces on opposite sides of the magnetically absorptive material.

11. A method as set forth in claim 10 wherein said dielectric and magnetically absorptive elements are aligned coaxially in said interruption.

12. A method as set forth in claim 10 wherein said dielectric and magnetically absorptive elements are aligned radially with respect to the conductor system.

13. A method of providing A.C. line isolation between a shielded conductor system and a television tuner input adapted to receive television signals from the conductor system, and for shielding the desired high frequency field within the conductor system from ambient electromagnetic interference, comprising:

providing an interruption between an outer shield associated with the conductor system, and an outer conductor associated with the tuner input; and disposing within the interruption a series of dielectric elements separated by abutting magnetically absorptive material to create a capacitive coupling across the interruption to isolate the shield and magnetic absorption within the interruption to absorb energy associated with the ambient electromagnetic interference.

14. A method as set forth in claim 13 wherein the interruption is established by providing an area of axial overlap between the outer conductor of the tuner input and the shield, and wherein the dielectric elements and magnetically absorptive material are disposed in said area of axial overlap.

15. A method as set forth in claim 14 wherein the outer conductor of the tuner input has a relatively large diameter and the shield associated with the conductor system has a relatively small diameter, and wherein the dielectric elements and magnetically absorptive material are disposed in an area of axial overlap between the relatively large diameter outer conductor and the relatively smaller diameter shield.

16. A method as set forth in claim 14, wherein said dielectric elements and magnetically absorptive material comprises at least two discrete elements of dielectric material separated by a discrete element of magnetically absorptive material.

17. A method of providing A.C. line isolation in a path coupling the shield of a shielded conductor to a conductor associated with the input of a television tuner, and for shielding the desired field within the shielded conductor from ambient electromagnetic interference, comprising:

providing an interruption in the path of coupling between the conductor associated with the tuner input and the shield; and filling the interruption with dielectric and magnetically absorptive material so as to create a first capacitance which decouples the path at A.C. line frequencies and shunts a substantial portion of electromagnetic interference induced in the outer skin of the shield, a region of magnetic absorption for absorbing residual electromagnetic interference not shunted by said first capacitance, and a second capacitance to provide additional A.C. decoupling of said path and to couple the signal within the shielded conductor to the tuner input and away from the region of magnetic absorption.

18. In a system employing a shielded conductor which carries a desired high frequency signal, and whose shield is adpated to be coupled to a low frequency power source, an isolator for isolating the conductor's shield from the low frequency power source and for shielding the desired field within the conductor from ambient high frequency electromagnetic interference, comprising:

means defining an interruption in the shield; and magnetically absorptive material and dielectric material situated within the interruption such that said materials are closely adjacent each other, said materials being selected and disposed to create a capacitive coupling across the interruption to isolate the shield and magnetic absorption within the interruption to absorb energy associated with the ambient electromagnetic interference.

19. An isolator as set forth in claim 18 including an inductance within the interruption for coacting with at least some of the dielectric material to form a resonator.

20. In a system employing a shielded conductor which carries a desired high frequency signal, and whose shield is adapted to be coupled to a low frequency power source, an isolator for isolating the conductor's shield from the low frequency power source and for shielding the desired field within the conductor from ambient high frequency electromagnetic interference, comprising:

means defining an interruption in the shield; and a series of dielectric elements separated by magnetically absorptive material filling said interruption to create a capacitive coupling across the interruption to isolate the shield and magnetic absorption within the interruption to absorb energy associated with the ambient electromagnetic interference.

21. An isolator as set forth in claim 20 wherein discrete elements of dielectric material are disposed in said interruption in alternating sequence with one or more discrete elements of magnetically absorptive material.

22. An isolator as set forth in claim 21 wherein the dielectric and magnetically absorptive elements are disposed in an abutting relationship with each other.

23. An isolator as set forth in claim 21 further including an inductance within the interruption for coacting with at least one element of dielectric material to provide a series resonant circuit at a selected television frequency.

24. An isolator as set forth in claim 23 wherein said one element of dielectric material has an outer conductive coating thereon, and wherein said inductance includes a conductive finger connected between the dielectric element's conductive coating and the shield.

25. An isolator as set forth in claim 21 wherein the shield includes a relatively large diameter portion separated by the interruption from a relatively smaller diameter portion, such that the relatively large diameter portion overlaps the smaller diameter portion, and wherein the dielectric and magnetically absorptive elements are disposed between overlapping portions of the shield.

26. An isolator as set forth in claim 21 wherein said dielectric and magnetically absorptive elements are aligned coaxially within the shield's interruption.

27. An isolator as set forth in claim 21 wherein the shield is interrupted with a pair of radial flanges arranged vis-av-s, and wherein said dielectric and magnetically absorptive elements are sandwiched between the flanges and concentrically arranged such that the alternating sequence is in a direction radial to the cable.

28. An isolator as set forth in claim 21 wherein the interruption is provided by separating the shield into two parts, turning the ends and interleaving the turned ends of the separated parts so as to provide a total of at least three spaces between the interleaved parts, and wherein magnetically absorptive material is disposed in one of said spaces and dielectric material is disposed in two of said spaces on opposite sides of the magnetically absorptive material.

29. An isolator as set forth in claim 28 wherein said dielectric and magnetically absorptive elements are aligned coaxially within the interruption.

30. An isolator as set forth in claim 28 wherein said dielectric and magnetically absorptive elements are aligned radially with respect to the conductor.

31. In a television receiver having a tuner connected via a coupling path to at least the shield of a shielded conductor for receipt of a television signal carried by the conductor, an isolator for isolating the shield from A.C. line voltages which may be coupled to the tuner and for shielding the field within the conductor from ambient high frequency electromagnetic interference, comprising:

means defining an interruption in the coupling path; and a series of dielectric elements separated by abutting magnetically absorptive material disposed in the interruption so as to create a capacitive coupling across the interruption to isolate the shield and magnetic absorption within the interruption to absorb energy associated with the ambient electromagnetic interference.

32. An isolator as set forth in claim 31, wherein discrete elements of dielectric material are disposed in said interruption in alternating sequence with one or more discrete elements of magnetically absorptive material.

33. An isolator as set forth in claim 32, wherein the tuner has a coaxial connection for coupling to the conductor, wherein said connection has an outer diameter greater than the outer diameter of the conductor for partly overlapping the conductor, and wherein the interruption is provided between the conductor's shield and the overlapping portion of the tuner connection.

34. An isolator as set forth in claim 33, wherein the dielectric and magnetically absorptive elements are aligned coaxially within the interruption.

35. An isolator as set forth in claim 34 including an inductance within the interruption for coacting with at least one element of dielectric material to form a resonator at a selected television frequency.

36. In a television receiver having a tuner receiving an RF signal carried by a shielded conductor, an isolator for isolating the conductor's shielded from A.C. line voltages which may be coupled to the tuner and for shielding the field within the shielded conductor from ambient high frequency electromagnetic interference, comprising:

shield means connected to the tuner and having a diameter which is larger than the diameter of the conductor's shield, said shield means being disposed to coaxially overlap the shielded conductor; and a pair of dielectric elements and a ferrite element disposed within said axial overlap, all said elements being disposed in abutting relationship with each other and aligned coaxially within the overlap.

37. In a system employing a shielded conductor which carries a desired high frequency signal and whose shield may be coupled to a low frequency power source, an isolator for isolating the conductor's shield from the low frequency power source and for shielding the desired field within the conductor from ambient high frequency electromagnetic interference, comprising:

means defining an interruption in the shield; and magnetically absorptive material and at least one resonator situated within the interruption.

38. An isolator as set forth in claim 37 wherein said resonator includes a dielecric element and distributed inductance associated therewith for establishing a condition of series resonance at selected television frequencies.

39. An isolator as set forth in claim 37 wherein the resonator includes dielectric material and an inductance coupled to the dielectric material.

40. An isolator as set forth in claim 39 wherein said dielectric material has an outer conductive coating, and wherein the inductance is coupled between the conductive coating and the shield.

41. An isolator as set forth in claim 40 wherein the inductance comprises a part of the shield which projects into the interruption.

42. An isolator as set forth in claim 41 wherein the dielectric material's conductive coating is held from electrical contact with the shield except via the inductance.

43. An isolator as set forth in claim 42 wherein said dielectric and magnetically absorptive materials are discrete elements disposed around the conductor, and further including in the interruption at least one additional discrete dielectric element which does not function as a resonator.

44. An isolator as set forth in claim 43 wherein the magnetically absorptive and additional dielectric element are annular in shape and have substantially the same outer diameter, and wherein the dielectric element forming part of the resonator has a relatively smaller outer diameter to inhibit its conductive coating from contacting the shield.

45. An isolator as set forth in claim 43 wherein the magnetically absorptive element and all the dielectric elements are annular in shape and have substantially the same outer diameter, and wherein the shield is formed to avoid contact between itself and the dielectric element which forms part of the resonator.

46. In a television system having a tuner for receiving an RF signal from a shielded conductor, an isolator for isolating the conductor's shield from low frequency power which may be coupled to the tuner and for shielding the RF field within the conductor from ambient high frequency electromagnetic interference, comprising:

- conductive means coupled to the tuner and mated with the conductor's shield so that an area of axial overlap occurs between the conductor's shield and the conductive means;
- at least first and second dielectric elements disposed in said area of axial overlap;
- a magnetically absorptive element disposed between the first and second dielectric elements; and
- an inductance associated with the first dielectric element to resonate with the first dielectric element at at least one selected television frequency.

47. An isolator as set forth in claim 46 wherein the dielectric elements abut the magnetically absorptive element.

48. An isolator as set forth in claim 46 wherein the first dielectric element has a conductive coating thereon, and wherein said inductance includes a conductive finger connected between the conductive coating and the conductive means.

49. An isolator as set forth in claim 48 wherein the conductive finger comprises a part of the conductive means, the dimensions of the finger and the properties of the first dielectric element being selected to establish series resonance at a frequency in the lower VHF television band.

50. An isolator as set forth in claim 48 wherein the conductive means and the first dielectric element are shaped to avoid electrical contact between the conductive means and the conductive coating except by means of the conductive finger.

51. An isolator as set forth in claim 46 wherein said first dielectric element has a conductive coating thereon with a gap in the coating to create a distributed form of said inductance, and including a relatively short electrical connection between said conductive means and the conductive coating.

52. An isolator as set forth in claim 51 wherein the first dielctric element is annular in shape with said conductive coating on the outer periphery thereof and another conductive coating on an inner periphery thereof, and wherein the mean circumference of the first dielectric element and its dielectric constant are selected to establish a condition of series resonance.

53. An isolator as set forth in claim 52 wherein series resonance is selected to occur at a frequency in the low VHF television band.

54. An isolator as set forth in claim 52 wherein the first dielecric element and its conductive coatings are selected to establish a condition of series resonance at multiple selected frequencies.

55. An isolator as set forth in claim 46 including an additional dielectric element and an inductance associated therewith for establishing another condition of series resonance.

56. For a television receiver having a tuner connected via a coupling path to at least the shield of a shielded conductor for receipt of a television signal carried by the conductor, the improvement comprising:

- means defining an interruption in the coupling path; and
- a series of dielectric elements separated by abutting magnetically absorptive material disposed in the interruption so as to create a capacitive coupling across the interruption and magnetic absorption within the interruption.

* * * * *